(12) United States Patent
Frey et al.

(10) Patent No.: US 9,451,732 B2
(45) Date of Patent: Sep. 20, 2016

(54) MULTISTAGE COOLING OF ELECTRONIC COMPONENTS OF AN AIRCRAFT

(71) Applicant: Airbus Deutschland GMBH, Hamburg (DE)

(72) Inventors: Andreas Frey, Immenstaad (DE); Ahmet Kayihan Kiryaman, Hamburg (DE); Markus Kerber, Reinfeld (DE); Michael Dreyhaupt, Hamburg (DE); Carsten Colberg, Hamburg (DE); Peter Schwebke, Elmenhorst (DE)

(73) Assignee: Airbus Operations GmbH (DE)

(*) Notice: Subject to any disclaimer, the term of this patent is extended or adjusted under 35 U.S.C. 154(b) by 0 days.

(21) Appl. No.: 14/062,300

(22) Filed: Oct. 24, 2013

(65) Prior Publication Data

US 2014/0146469 A1    May 29, 2014

Related U.S. Application Data

(63) Continuation of application No. 12/514,731, filed as application No. PCT/EP2007/010049 on Nov. 20, 2007, now abandoned.

(60) Provisional application No. 60/914,362, filed on Apr. 27, 2007, provisional application No. 60/866,453, filed on Nov. 20, 2006.

(30) Foreign Application Priority Data

Nov. 20, 2006    (DE) .................. 10 2006 054 560
Apr. 27, 2007    (DE) .................. 10 2007 020 037

(51) Int. Cl.
*F25B 7/00*    (2006.01)
*B60H 1/00*    (2006.01)
(Continued)

(52) U.S. Cl.
CPC .......... *H05K 7/20845* (2013.01); *B64D 13/06* (2013.01); *H05K 7/20127* (2013.01);
(Continued)

(58) Field of Classification Search
USPC .............. 62/333, 335, 292, 310, 314, 259.2; 165/80.4, 104.14, 104.28, 104.31, 165/104.33; 361/699, 700
See application file for complete search history.

(56) References Cited

U.S. PATENT DOCUMENTS 3,387,648 A    6/1968   Ward et al.
3,842,460 A *  10/1974  Wulf ...................... 15/250.27
(Continued)

FOREIGN PATENT DOCUMENTS

DE    3812739 C1    7/1989
DE    4105034 A1    8/1992
(Continued)

OTHER PUBLICATIONS

Decision on Granting a Patent for Invention for Russian Patent Application No. 2009122348/11, dated Feb. 15, 2012 (2 pages).
(Continued)

*Primary Examiner* — Frantz Jules
*Assistant Examiner* — Erik Mendoza-Wilkenfe
(74) *Attorney, Agent, or Firm* — Barnes & Thornburg LLP

(57) ABSTRACT

The invention discloses the multistage cooling of an aircraft electronic system (2) with at least one electronic component which delivers heat. The multistage feature results from the use of a plurality of circuits for transferring the waste heat. An internal coolant (14) circulating in a closed circuit which is thermally coupled to the electronic component carries heat from the at least one electronic component to a heat exchanger (6) which delivers the heat to an external coolant which flows and/or circulates from a source outside of the aircraft electronic system (2) through the heat exchanger (6) to a sink outside of the aircraft electronic system (2). The internal coolant flows from the heat exchanger (6) in the direction of the at least one electronic component and/or circulates in a closed circuit.

12 Claims, 4 Drawing Sheets

(51) Int. Cl.
  *H05K 7/20* (2006.01)
  *B64D 13/06* (2006.01)
(52) U.S. Cl.
  CPC ...... *H05K7/20218* (2013.01); *H05K 7/20872* (2013.01); *B64D 2013/0614* (2013.01); *Y02T 50/44* (2013.01); *Y02T 50/56* (2013.01)

(56) References Cited

U.S. PATENT DOCUMENTS

| | | | |
|---|---|---|---|
| 4,210,102 | A | 7/1980 | Dosmann |
| 4,739,823 | A | 4/1988 | Howard |
| 4,969,509 | A | 11/1990 | Merensky |
| 5,058,391 | A | 10/1991 | Periot |
| 5,415,012 | A | 5/1995 | Maier-Laxhuber et al. |
| 5,447,042 | A * | 9/1995 | Ohuchi et al. ............... 62/476 |
| 5,477,706 | A | 12/1995 | Kirol et al. |
| 5,491,979 | A | 2/1996 | Kull et al. |
| 5,513,500 | A | 5/1996 | Fischer et al. |
| 5,653,111 | A | 8/1997 | Attey et al. |
| 6,052,284 | A * | 4/2000 | Suga et al. .................. 361/699 |
| 6,205,803 | B1 | 3/2001 | Scaringe |
| 6,350,376 | B1 * | 2/2002 | Imaoka et al. ............. 210/198.1 |
| 6,530,420 | B1 * | 3/2003 | Takada et al. ............ 165/104.33 |
| 7,281,388 | B2 * | 10/2007 | Pokhama et al. ............ 62/259.2 |
| 2001/0017039 | A1 | 8/2001 | Weimer |
| 2004/0165351 | A1 * | 8/2004 | Tsai et al. .................... 361/701 |
| 2004/0221604 | A1 | 11/2004 | Ota et al. |
| 2005/0072174 | A1 * | 4/2005 | Beers .................... B63J 2/04 62/228.1 |
| 2005/0103725 | A1 * | 5/2005 | Palm et al. .................. 210/760 |
| 2005/0210910 | A1 | 9/2005 | Rigney et al. |
| 2005/0253019 | A1 * | 11/2005 | Hoehne et al. ............. 244/129.1 |
| 2007/0051166 | A1 * | 3/2007 | Baker et al. ................ 73/40.5 R |
| 2008/0087039 | A1 * | 4/2008 | Reed .................... B64D 11/02 62/498 |

FOREIGN PATENT DOCUMENTS

| | | |
|---|---|---|
| DE | 69005701 T2 | 4/1994 |
| DE | 4327444 A1 | 2/1995 |
| DE | 4340316 A1 | 6/1995 |
| DE | 4340317 | 3/1996 |
| DE | 19811719 A1 | 9/1999 |
| DE | 10009521 A1 | 8/2001 |
| DE | 69528783 T2 | 7/2003 |
| DE | 20308158 U1 | 9/2003 |
| DE | 10332770 A1 | 2/2005 |
| DE | 102004019790 A1 | 11/2005 |
| DE | 102004020642 A1 | 11/2005 |
| DE | 102005015718 A1 | 10/2006 |
| DE | 102006041788 A1 | 3/2008 |
| DE | 102006054560 A1 | 5/2008 |
| EP | 0655592 A1 | 10/1994 |
| EP | 0655593 A | 5/1995 |
| EP | 1158389 A2 | 11/2001 |
| EP | 1448040 A1 | 2/2004 |
| FR | 2820196 A1 | 8/2002 |
| JP | 6159854 A | 6/1994 |
| JP | 7225074 A | 8/1995 |
| JP | 8254369 A | 10/1996 |
| JP | 2004-246649 A1 | 2/2004 |
| RU | 2106584 C1 | 3/1998 |
| RU | 2127212 C1 | 3/1999 |

OTHER PUBLICATIONS

Decision on Granting a Patent for Invention for Russian Patent Application No. 2009122347/11, dated Feb. 10, 2012 (4 pages).
English Translation of the First Office Action titled "Notice of Reasons for Rejection," issued for the parallel Japanese Patent Application No. 2009-5636675, dated Jul. 10, 2012 (3 pages).
English Translation of First Office Action for parallel Japanese Patent Application No. 2009-536674, dated Jun. 27, 2012 (3 pages).
PCT International Search Report for PCT/EP2007/010050 completed by the EP Searching Authority on Feb. 26, 2008.
Styppa, H.; Schaltschrank-Klimatisierung, Verlag Moderne Industrie, Landsberg, 1992, iSBN 3-478-93080-4, pp. 18 to 25, 56 to 59.

* cited by examiner

MULTISTAGE COOLING OF ELECTRONIC COMPONENTS OF AN AIRCRAFT

CROSS REFERENCE TO RELATED APPLICATIONS

This application is a continuation of U.S. patent application Ser. No. 12/514,731 filed Aug. 31, 2009 and entitled MULTISTAGE COOLING OF ELECTRONIC COMPONENTS OF AN AIRCRAFT, which is a U.S. national counterpart application of international application serial No. PCT/EP2007/010049 filed Nov. 20, 2007, which claims priority to U.S. Provisional Patent Application No. 60/866,453 filed Nov. 20, 2006, to German Patent Application No. 102006054560.5 filed Nov. 20, 2006, to U.S. Provisional Patent Application No. 60/914,362 filed Apr. 27, 2007, and to German Patent Application No. 102007020037.6 filed Apr. 27, 2007, the disclosures of which are each incorporated herein by reference in their entirety.

The invention relates to multistage cooling of electronic components and electronic assemblies, in particular of an electronic entertainment system, in an aircraft.

Electronic entertainment systems are an essential part of the comfort provided for an air passenger in modern passenger aircraft. The requirements to be met by the entertainment electronics depend on increasingly more efficient electronic components, electronic assemblies and computer systems. The accompanying high power density results in the generation of a continuously increasing amount of waste heat, which must be removed in order to ensure that the entertainment electronics can operate over a long period of time.

Modern electronic systems and, in particular, entertainment systems of an aircraft require such large quantities of air for cooling them that these cannot always be removed from the surrounding air-conditioned passenger cabin. In order to cool electronic aircraft entertainment systems, long air ducts, for example, are used in the prior art in order to supply an appropriate quantity of cold air to the aircraft electronic system and to remove heated air from the latter. These long air ducts are difficult to install in an aircraft, as they must have special minimum bend radii and, on account of their relatively large cross section, take up space which could be used for other aircraft components.

Also known are cooling systems for the entertainment electronics of an aircraft which draw in air from a bilge region or a cargo region in order to cool an entertainment system of the aircraft. However these non-air-conditioned regions have the disadvantage of depending on the ambient air temperature. The temperature of the air in the bilge region and in the cargo compartment can rise significantly when the aircraft is on the ground.

Components of the aircraft electronic system may be damaged on account of a high operating temperature.

It is an object of the invention to provide an aircraft electronic system with efficient cooling.

A multistage cooling system for an aircraft electronic system, in particular an electronic aircraft entertainment system, comprises at least one electronic component which delivers heat. The aircraft electronic system also comprises a closed circuit which is thermally coupled to the electronic component and in which an internal coolant circulates in order to carry heat from the at least one electronic component to a heat exchanger. The heat exchanger is adapted to deliver the heat with which it is supplied by the internal coolant to an external coolant which flows and/or circulates from a source outside of the aircraft electronic system through the heat exchanger to a sink outside of the aircraft electronic system. The closed circuit of the to aircraft electronic system is configured so that the internal coolant flows from the heat exchanger in the direction of the at least one electronic component. The at least one component of the aircraft electronic system is therefore cooled by a multistage cooling system, wherein the heat exchanger can be associated with precisely one aircraft electronic system. The multistage feature results from the use of a plurality of cooling circuits.

Generally speaking, it was initially to be expected that the use of a multistage cooling system to cool an aircraft electronic system would lead to a weight increase of particular disadvantage in aircraft construction. However it surprisingly became apparent that, depending on the aircraft size and the number of installed aircraft electronic systems, it is even possible to achieve a weight reduction, as the long air ducts initially mentioned are omitted. The closed internal circuit in particular contributes to efficient cooling, which enables the refrigerating devices of the aircraft to be of a smaller design.

As the internal coolant circulates in a closed circuit, no dirt is brought into the aircraft electronic system by the coolant. This increases the functional reliability of the electronic aircraft electronic system. Should the aircraft electronic system malfunction, contamination of the external coolant is prevented. The fail safety of other aircraft components which are cooled with the external coolant is as a result increased. Moreover, the thermal behaviour of the aircraft electronic system and the cooling thereof can be tested independently of other cooling devices of the aircraft.

The aircraft electronic system can be disposed in an electronics cabinet, a so-called rack. The aircraft electronic system can be located in a closed container. The heat exchanger can be disposed inside or outside of the container for the aircraft electronic system.

The internal coolant is cooled in the heat exchanger by the external coolant which flows through the latter. The internal coolant is therefore actively cooled. The closed circuit of the internal coolant can represent an internal cooling circuit. The internal cooling circuit can comprise the heat exchanger as the only heat sink. Therefore the internal coolant does not pass through an evaporator of a refrigerating machine or similar. The external coolant can circulate in a closed circuit which can form an external cooling circuit. The external coolant can be actively cooled. In the case of a closed external cooling circuit a pump or a cooling system for the external coolant can be considered both as a source and as a sink.

The internal coolant can be at a temperature which is different to that of the external coolant. The aircraft electronic system can as a result always be kept within a suitable temperature range, irrespective of the temperature of the external coolant. Moreover, high temperature gradients within the aircraft electronic system on account of a possibly very cold external coolant are prevented.

The closed circuit can be thermally coupled to a plurality of electronic components, so that the internal coolant can cool a plurality of electronic components.

The internal coolant can be gaseous. The internal coolant can circulate on the basis of natural convection or on the basis of forced convection. The forced convection can be produced by a fan, for example. If the internal coolant is gaseous, no smoke can enter the cabin in the event of the aircraft electronic system malfunctioning, as the gaseous internal coolant circulates in a closed circuit and the aircraft electronic system is located in a closed container.

As the gaseous internal coolant circulates in a closed circuit, the formation of condensation water at the electronic components and/or inside the aircraft electronic system is prevented. The gaseous internal coolant preferably has a low air humidity.

The internal coolant can be liquid and circulate on the basis of natural convection or on the basis of forced convection. The forced convection can be guaranteed by a pump. The liquid coolant can flow around individual components, through the printed circuit boards of electronic assemblies, and/or coolant can flow completely or partly through the container, so that coolant flows around the electronic components. It is in addition possible to dispose electronic assemblies on bodies through which liquid flows. The advantage of this lies in the fact that the circuit of the internal coolant does not have to be opened when an electronic assembly is to be replaced. Further possibilities for cooling electronic assemblies which can be employed in the present invention are described in DE 10 2006 041 788.7 or the corresponding international application, the content of which is hereby included by reference. The applicant expressly reserves the right to direct an application for protection on a combination of the content of this application and the content of DE 10 2006 041 788.7.

The internal coolant can always be in the gaseous or in the liquid state when flowing through the cooling circuit. However the internal coolant can also change its state from gaseous to liquid and vice versa when flowing through the cooling circuit.

Preferably, the circuit of the internal coolant is connectable to a feed line via which a further coolant can be supplied from outside into the closed circuit in order to cool the at least one electronic component. In other words, the circuit of the internal coolant is adapted to be opened in order to enable a coolant which is supplied from outside to cool the at least one electronic component. Valves can be provided in order to open the circuit of the internal coolant. Should the fan or the pump of the circuit of the internal coolant fail, no forced convection takes place in the aircraft electronic system. This can lead to failure of the aircraft electronic system. In this case the previously described valves can be opened, so that the external coolant, as further coolant, cools the components. A further coolant supplied from outside can be used if the external coolant or the heat exchanger fails.

The external coolant can circulate in a circuit which is connected to a liquid cooling system in order to cool the external coolant. In this case the external coolant can be liquid. A liquid external coolant has the advantage that only a relatively small cross section is required for the lines of the external coolant, as a liquid coolant can remove substantially more heat than a gaseous coolant. A central liquid cooling system or a plurality of decentralised liquid cooling systems can be provided in the aircraft.

If the external coolant is liquid, the internal coolant can be gaseous or liquid, in which case a liquid coolant is preferred, so that, in the event of a failure, the external coolant can be used to cool the at least one component. As previously mentioned, the internal coolant can be at a higher temperature than the external coolant, so that the components of the aircraft electronic system are within a suitable temperature range and high temperature gradients within the aircraft electronic system are prevented. The air-conditioning system of an aircraft could have smaller dimensions if using a liquid cooling system.

The external coolant can always be in the gaseous or in the liquid state when flowing through the cooling circuit. However the external coolant can also change its state from gaseous to liquid and vice versa when flowing through the cooling circuit.

The liquid external coolant and/or the liquid internal coolant can be replaced during operation by water from a water system, for example the fresh water system, of the aircraft. For this purpose the closed circuit in which the internal coolant circulates and/or the circuit in which the liquid external coolant circulates is connectable to a water system of the aircraft. It is as a result possible to compensate for leakages also during flight, and the electronic devices of the aircraft and, in particular, the aircraft electronic system, can continue to be operated. Additives can be admixed with the water which replaces the internal and/or external coolant.

The external coolant can be cooled with an adsorption cooling system. For this purpose the heat exchanger through which the external coolant flows is preferably connected to the adsorption cooling system. A plurality of decentralised adsorption cooling systems can be provided in the aircraft. DE 10 2006 054 560.5 or the corresponding international application, the content of which is hereby included by reference, discloses an adsorption cooling system for an aircraft. An adsorption cooling system described therein can be used in the present invention. The applicant expressly reserves the right to direct an application for protection on any desired combination of the content of this application and the content of DE 10 2006 054 560.5.

The external coolant can be fresh water. The fresh water can flow from a fresh water tank to a waste water tank. The fresh water can also flow from a fresh water tank to a tank for heated fresh water. The fresh water can be used as coolant in particular, in an emergency if the liquid cooling system or the adsorption cooling system for the external coolant has failed. The fresh water can be cooled by another cooling system after flowing through the heat exchanger and returned to the fresh water tank again. Additives for improving the cooling properties can be added to the fresh water which is used as coolant. The above-mentioned valves can also be opened in an emergency, so that the fresh water cools the components and/or assemblies of the aircraft electronic system directly, provided that the liquid in question is not conductive or the internal circuit is equipped with a plate-shaped heat exchanger on which the assemblies are mounted.

The external coolant can be gaseous. Air can be used as the external coolant, for example. If the external coolant is gaseous, it is preferable for the internal coolant likewise to be gaseous. Should the forced convection of the internal coolant fail, in this case the previously described valves can be opened, so that the external coolant cools the at least one electronic component. The internal coolant can be at a temperature which is different to that of the external coolant. The internal coolant can be at a higher temperature than the external coolant, so that the electronic components of the aircraft electronic system are within the optimum temperature range and no excessively high temperature gradients occur within the aircraft electronic system. The external coolant can be at a higher pressure than the environment.

The invention also relates to an aircraft electronic system with at least one electronic component which delivers heat and a closed circuit which is thermally coupled to the electronic component and in which an internal coolant circulates in order to carry heat from the at least one electronic component to a Peltier element. The closed circuit of the aircraft electronic system is configured so that the internal coolant flows from the Peltier element in the direction of the at least one electronic component. In this aircraft electronic system the Peltier element forms the heat exchanger. The Peltier element is connected to the electrical power supply of the aircraft, so that cold can be generated on the basis of a flow of current.

The invention further relates to an aircraft electronic system with at least one electronic component which delivers heat and a closed circuit which is thermally coupled to the electronic component and in which an internal coolant circulates in order to carry heat from the at least one electronic component to a heat exchanger of a refrigerating machine with a compressor, a condenser and an evaporator. The closed circuit of the aircraft electronic system is configured so that the internal coolant flows from the heat exchanger of the refrigerating machine in the direction of the at least one electronic component. The external coolant therefore changes its state from gaseous to liquid and vice versa. The heat exchanger can be the evaporator. The refrigerating machine can be associated with one or a plurality of aircraft electronic system(s).

Embodiments of the invention and cooled aircraft electronic systems are illustrated by way of example in the following with reference to the accompanying drawings. The applicants expressly reserves the right to direct an application for protection on any cooled aircraft electronic system which is described in the following. The applicant also reserves the right to direct an application for protection on a combination of the aircraft electronic systems which are described in the following or the cooling thereof.

The cooling of an aircraft electronic system is now described in greater detail using the example of an electronic aircraft entertainment system. It is understood that the teaching described in the following can be employed in any aircraft electronic system.

Figure 1:
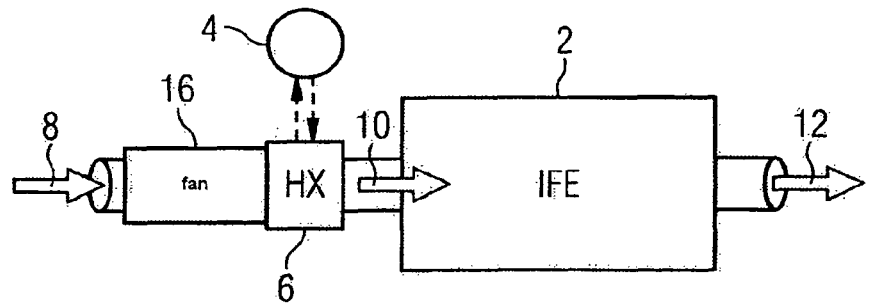
FIG. 1 shows an electronic aircraft entertainment system which is cooled with an actively cooled airstream.

FIG. 1 shows an electronic aircraft entertainment system 2 (IFE: In flight Entertainment System) which is cooled by an airstream 8, 10, 12. A fan 16 draws in air 8 from the environment and supplies it to a heat exchanger 6. The air 8 which is drawn in is the internal coolant. The heat exchanger 6 is connected to a cooling system via a connection 4. An external coolant, which can be gaseous or liquid, is supplied to the heat exchanger 6 via the connection 4. The air 8 which is supplied to the heat exchanger 6 by the fan 16 is delivered as cooled air 10 and flows into the electronic aircraft entertainment system 2. As it cools the electronic components of the aircraft entertainment system the air warms up and leaves the aircraft entertainment system 2 as relatively warm outlet air 12. The temperature of the air 10 leaving the heat exchanger 6 is lower than the temperature of the air 8 which is drawn in as well as the temperature of the outlet air 12 leaving the aircraft entertainment system 2.

Figure 2:
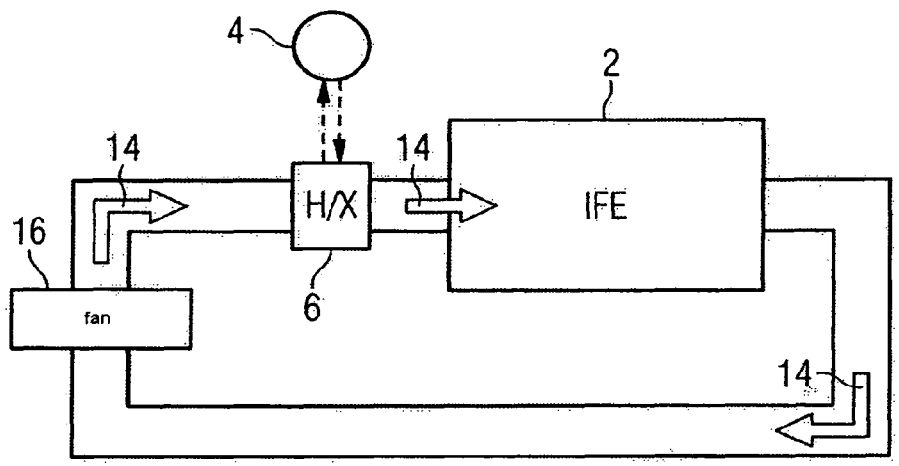
FIG. 2 shows an embodiment of the invention in which the electronic aircraft entertainment system comprises a closed internal coolant circuit which contains air.

FIG. 2 shows an embodiment of the invention in which an internal coolant 14 circulates in a closed circuit. The internal coolant 14 is air, although any other desired gaseous coolant can be used. The fan 14 provides forced convection. The heat exchanger 6 cools the internal coolant before it enters the electronic aircraft entertainment system 2.

The electronic aircraft entertainment system 2 comprises a closed container or a closed housing in order to minimise the loss of internal coolant 14. It is possible to pressurise the internal coolant 14 to a pressure which is higher than ambient pressure. The heat exchanger 6 is connected via a connection 4 to a cooling system which supplies an external coolant. The external coolant can be gaseous or liquid.

The temperature of the internal coolant 14 can be in a range which is different to that of the external coolant. The components of the aircraft electronic system 2 can as a result be kept within a suitable temperature range, irrespective of the temperature of the external coolant. The internal coolant 14 preferably has a low moisture content.

This embodiment of the invention has the advantage of preventing condensation water from precipitating. This embodiment of the invention also has the advantage of no dirt being brought into the electronic aircraft entertainment system 2 by the internal coolant 14, as the internal coolant 14 circulates in a closed circuit. If smoke is produced on account of the electronic aircraft entertainment system 2 malfunctioning, this cannot enter the cabin, as the smoke remains in the closed circuit of the internal coolant. The passengers of the aircraft are consequently not alarmed by the possible development of smoke.

Figure 3:
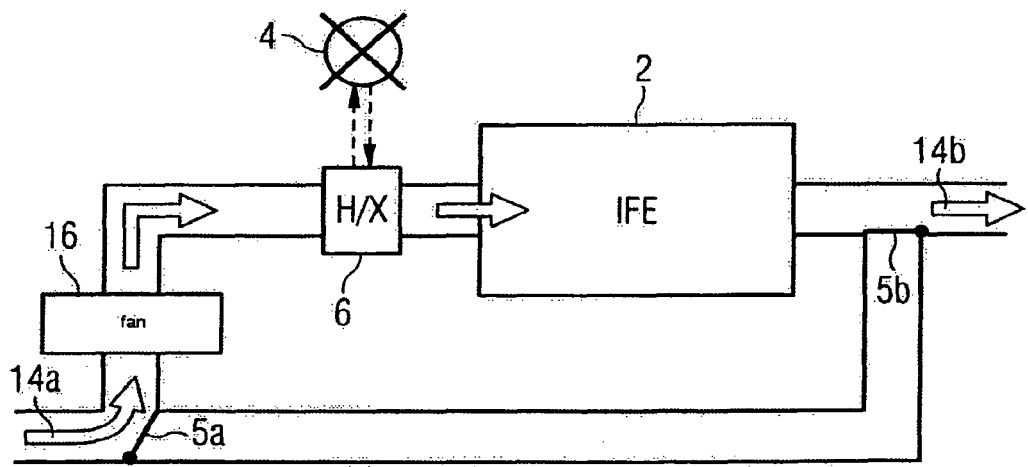
FIG. 3 shows an embodiment of the invention in which the closed circuit of the internal coolant can be opened in order that the electronic aircraft entertainment system can be cooled with a coolant which is supplied from outside.

FIG. 3 shows an embodiment of the invention in which the circuit of the internal coolant can be opened. If the fan 16, the flow of the external coolant or the cooling of the external coolant fails, so that there is no cooled external coolant at the connection 4 of the heat exchanger 6, valves 5a and 5b are switched so that a further coolant stream with a coolant 14a, 14b supplied from outside flows through the electronic aircraft entertainment system 2. In the embodiment which is shown in FIG. 3 the internal coolant is gaseous and the coolant which is supplied from outside must consequently also be gaseous. It is also possible to dispose the valves 5a and 5b so that the external coolant flows through the electronic aircraft entertainment system 2. However this arrangement has no redundancy in the case of a failure where the flow of the external coolant or the cooling of the external coolant fails.

If the internal coolant is gaseous, the previously described fan, the heat exchanger 6 and the connection 4, described previously in connection with FIGS. 1 to 3, of the heat exchanger 6 can be formed integrally as a unit. This unit can be disposed in the aircraft entertainment system 2.

Figure 4:
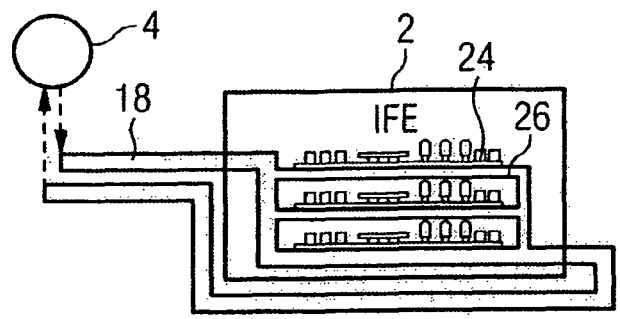
FIG. 4 shows an embodiment of the invention in which the internal coolant is liquid and assemblies of the electronic aircraft entertainment system are disposed on plate-shaped heat exchangers.

FIG. 4 shows a liquid-cooled electronic aircraft entertainment system 2. Liquid coolant is supplied to the aircraft entertainment system 2 via a connection 4 and a line 18. A plurality of electronic assemblies 24 are disposed on a plate-shaped heat exchanger 26 through which cooling liquid flows. A liquid coolant can remove a substantially greater quantity of heat from the aircraft entertainment system 2, so that the lines 18 can have a smaller cross section. If the electronic aircraft entertainment system 2 is cooled with a liquid coolant, any desired cooling arrangement which is described in DE 10 2006 041 788.7 can be used.

Figure 5:
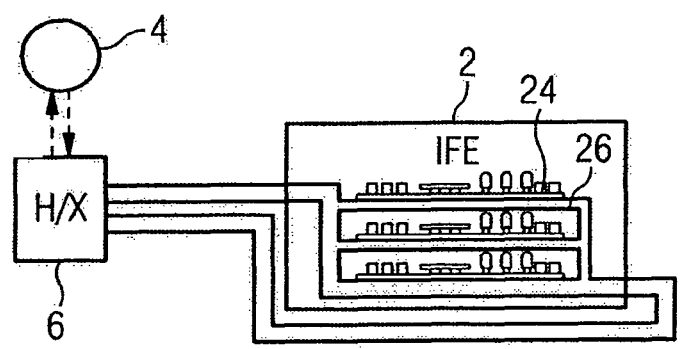
FIG. 5 shows an embodiment of the invention with a heat exchanger wherein the internal coolant is liquid.

FIG. 5 shows a further embodiment of a liquid-cooled electronic aircraft entertainment system. This embodiment comprises, in addition to the embodiment of FIG. 4, a heat exchanger 6 which delivers the heat of the internal coolant to the external coolant. The external coolant flows through a connection 4 into the heat exchanger 6. The external coolant can be liquid or gaseous. On account of the heat exchanger 6, the internal coolant can be within a temperature range which is different to that of the external coolant, thereby ensuring that the electronic components of the aircraft entertainment system 2 are always within an optimum temperature range and high temperature gradients in the aircraft entertainment system are prevented. A pump which is responsible for forced convection can be provided in the circuit of the internal coolant. Any desired arrangement which is described in DE 10 2006 041 788.7 can also be used to cool the electronic components or assemblies of the aircraft entertainment system 2 in this embodiment.

The pump, the heat exchanger 6 and the connection 4 can be formed integrally as a unit. This unit can be disposed in the aircraft entertainment system 2.

The cooling of an aircraft entertainment system 2 with a closed circuit of the internal coolant can be tested independently of the cooling system of the aircraft. Moreover, no dirt can be transferred between the external and the internal coolant. This aircraft entertainment system 2 with the heat exchanger 6 and the connection 4 can also be replaced particularly easily.

Figure 6:
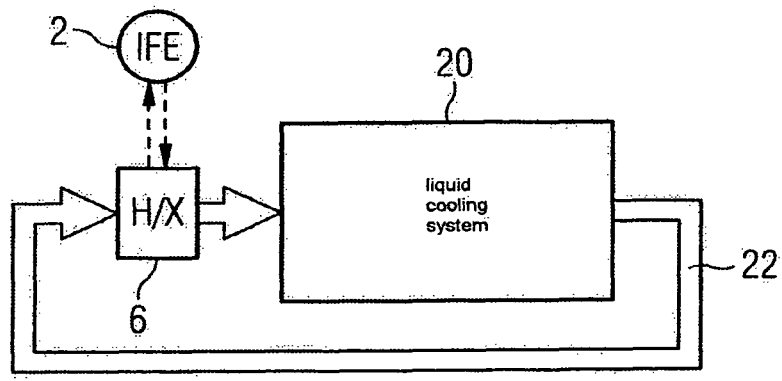
FIG. 6 shows an embodiment of the invention in which the external coolant is cooled by a liquid cooling system.

FIG. 6 shows an embodiment of the invention in which the external coolant is constantly in the liquid state. The external coolant circulates in a closed circuit 22. A liquid cooling system 20 cools the external coolant. The external coolant absorbs the heat which is generated by the aircraft entertainment system 2 via a heat exchanger 6.

If a liquid cooling system 20 is used, the mass of the aircraft increases to a lesser extent when compared with a conventional cooling system which supplies cold air to the aircraft entertainment system 2 which is to be cooled or the heat exchanger 6. If the external coolant is liquid, pipelines having a smaller cross section can be used, as distinctly larger quantities of heat can be transported away with a liquid coolant than with a gaseous coolant. The space required for cooling is as a result also reduced. On account of the smaller cross section of the coolant lines, the coolant lines of a liquid-based cooling system can be installed in the aircraft with greater flexibility, i.e. with fewer restrictions, and also supply with a high cooling capacity locations which could not be supplied with such a high cooling capacity by a conventional cooling system. Furthermore, if the external coolant is liquid, the previously described improvement in efficiency results in a lower power consumption for cooling the aircraft entertainment system and therefore the entire aircraft.

In the embodiment which is depicted in FIG. 6 the external coolant can be gaseous or liquid. The electronic aircraft entertainment system 2 and the circuit with the internal coolant can be formed as described on connection with FIGS. 1 to 3, with the closed cooling circuit according to FIGS. 2 and 3 being preferred. If a liquid internal coolant is used, the electronic aircraft entertainment system 2 and the circuit with the internal coolant can be formed as described in connection with FIGS. 4 to 5.

The liquid cooling system can be a central or decentralised liquid cooling system.

Figure 7:
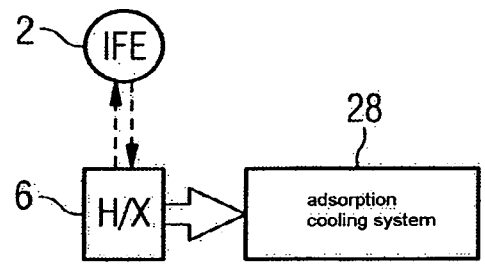
FIG. 7 shows an embodiment of the invention in which the external coolant is cooled by an adsorption cooling system.

FIG. 7 shows an embodiment in which the external coolant 6 is cooled by an adsorption cooling system. The external coolant flows through the heat exchanger 6 in order to absorb from the internal coolant the heat which is generated by the aircraft entertainment system 2. The internal coolant can be gaseous or liquid, the internal coolant can flow in a closed circuit and/or the aircraft entertainment system 2 can be cooled as was described with regard to FIGS. 1 to 5.

An adsorption cooling system 28 can be used as a local cooling system which is independent during flight. However it is also possible for a central adsorption cooling system to be provided.

Figure 8:
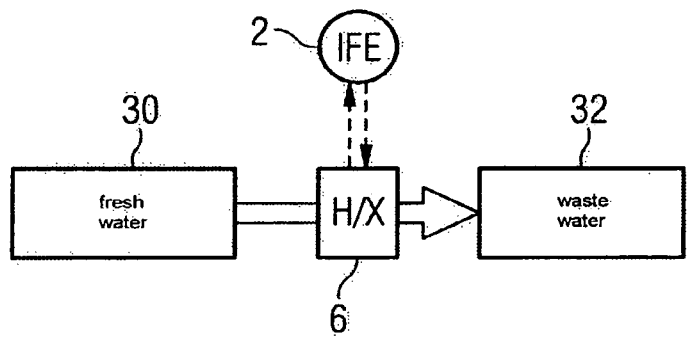
FIG. 8 shows an embodiment of the invention in which the external coolant is fresh water.

FIG. 8 shows an embodiment in which the external coolant is fresh water. The external coolant flows from a fresh water container 30 via a heat exchanger 6 to a waste water container 32. In the process the external coolant absorbs the heat of the internal coolant which is generated by the electronic aircraft entertainment system 2. The electronic aircraft entertainment system 2 can be formed and cooled as was described with regard to FIGS. 1 to 5. After the water has flowed through the heat exchanger 6, the water can also flow into a hot water container. This type of cooling can be provided as emergency cooling, for example. Referring to FIGS. 4 and 5, the fresh water can also be used to directly cool the electronic components or assemblies of the aircraft entertainment system 2 by opening the circuit of the internal coolant through valves, for example.

Figure 9:
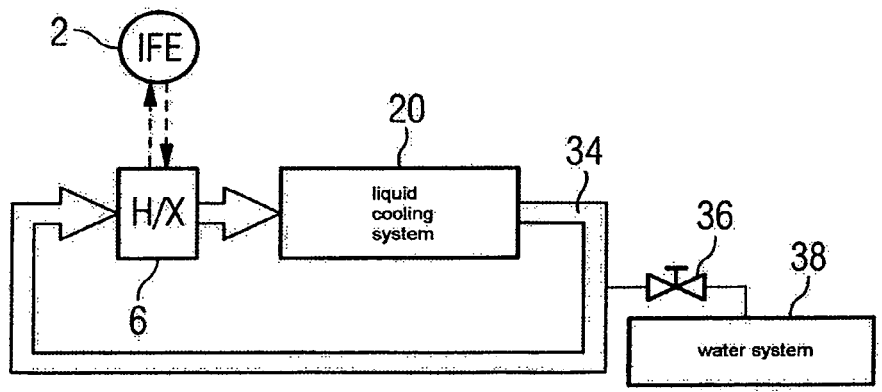
FIG. 9 shows an embodiment of the invention in which the external coolant can be replenished with water during operation.

FIG. 9 shows a further embodiment of the invention in which a liquid external coolant flows through a cooling circuit 34 with the heat exchanger 6 and the liquid cooling system 20. Should there be a leakage in the circuit of the external coolant, water can be supplied as external coolant from the water system 38 of the aircraft via a valve 36, so that substantially the original quantity of liquid external coolant can be re-established. The valve 36 can be actuated automatically, even during flight.

Figure 10:
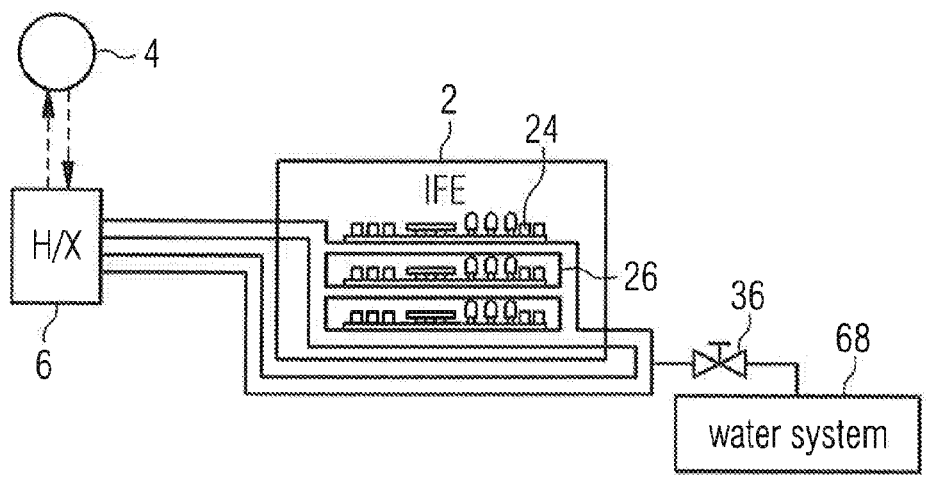
FIG. 10 shows an embodiment of the invention in which the internal coolant can be replenished with water.

FIG. 10 shows a further embodiment of the invention in which a liquid internal coolant flows through the heat exchanger 6 and the plate-shaped heat exchanger 26 to cool the electronic assembles 24 of an electronic aircraft entertainment system 2. Should there be a leakage, the valve 36 can be opened in order to remove water from the water system 38 of the aircraft to replenish the internal coolant. The valve 36 can be actuated automatically, even during flight.

Figure 11:
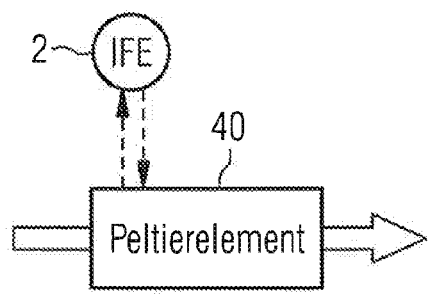
FIG. 11 shows an embodiment of the invention in which a Peltier element replaces the heat exchanger.

FIG. 11 shows a further embodiment of the invention in which a Peltier element 40 replaces the heat exchanger. In the case of a Peltier element 40 a temperature difference is produced through applying an electrical voltage and the associated flow of current. This temperature difference can be used to cool a medium. In the embodiment which is represented in FIG. 11 the Peltier element 40 cools the internal coolant, which was heated upon cooling the electronic aircraft entertainment system 2. The electronic aircraft electronic system 2 and the cooling thereof can be formed as was described with regard to FIGS. 1 to 5.

If the internal coolant is gaseous, a Peltier element or a plurality of Peltier elements can be disposed in the circuit of the internal coolant. The other side of the Peltier element can be disposed outside of the circuit of the internal coolant and deliver the heat to the environment or a coolant by means of a cooling body.

A Peltier element can also supply a liquid internal coolant with cold and a Peltier element can consequently also be used in conjunction with the embodiments which are depicted in FIGS. 4 and 5.

Figure 12:
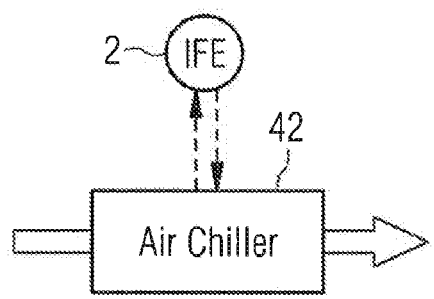
FIG. 12 shows an embodiment in which the internal coolant is cooled with a refrigerating machine.

FIG. 12 is an embodiment in which the internal coolant for cooling the electronic aircraft entertainment system 2 is cooled by a refrigerating machine 42, a so-called air chiller. The refrigerating machine 42 comprises a compressor, a condenser and an evaporator. The refrigerating machine can, for example, be formed as a local, decentralised refrigerating machine. The external coolant changes its state from gaseous to liquid and vice versa in a closed circuit.

The electronic aircraft entertainment system 2 can in this respect be composed and cooled as was described in connection with FIGS. 1 to 3 if the internal coolant is gaseous. If the internal coolant is liquid, the aircraft entertainment system 2 can be composed and cooled as was described in connection with FIGS. 4 and 5.

One advantage of the present invention is that, on account of the closed circuit of the internal coolant, no dirt can enter the aircraft electronic system. As a result of separating the external coolant from the internal coolant by means of the heat exchanger 6, which is responsible for a heat transfer between the external and the internal coolant, it is possible for the internal coolant to have a temperature range which is optimum for the electronic components and assemblies. High temperature gradients in the aircraft electronic system can as a result also be prevented. Moreover, the precipitation of condensation water is prevented due to the closed circuit of the internal coolant. The cooling of the aircraft electronic system is independent of the air-conditioning system of the aircraft. The described type of cooling of the aircraft electronic system produces less noise than conventional electronic cooling systems. As the airstream which is intended for the cabin is not used for cooling the aircraft electronic system, the comfort of an air passenger is not reduced. If the external coolant is liquid, the previously described improvement in efficiency results in a lower power consumption for cooling the aircraft electronic system and therefore the entire aircraft. The air-conditioning system which is used for the air conditioning of the cabin can therefore be of a smaller design, which entails an additional weight saving.

The invention claimed is:

1. A multistage cooling system for an aircraft electronic system including a plurality of electronic components, the multistate cooling system comprising,
    a container containing the aircraft electronic system therein,
    a heat exchanger, and
    an inner circuit, partially defined by the container, in which a liquid or gas inner coolant in direct contact with at least one of the plurality of electronic components of the aircraft electronic system circulates through the heat exchanger, the inner circuit configured such that the inner coolant flows from the heat exchanger in the direction of the container,
    an outer circuit in which a liquid outer coolant circulates through the heat exchanger,
    a liquid cooling system, coupled to the outer circuit, to cool the liquid outer coolant, and
    a valve, connectable between the outer circuit and a further water container, via which liquid outer coolant lost from the outer circuit is at least partially replaced by water from the further water container during operation of the aircraft electronic system,
    wherein the heat exchanger is configured to deliver heat supplied thereto by the inner coolant to the liquid outer coolant supplied thereto from outside of the aircraft electronic system,
    and wherein the liquid outer coolant is fresh water supplied from a fresh water container which flows through the outer circuit and to the further water container.

2. The multistage cooling system of claim 1, wherein the inner circuit is thermally coupled to the plurality of electronic components so that the inner coolant cools the plurality of electronic components.

3. The multistage cooling system of claim 1, wherein the inner coolant is gaseous.

4. The multistage cooling system of claim 3, wherein the inner circuit is configured so that the inner coolant circulates through the inner circuit via natural convection.

5. The multistage cooling system of claim 3, wherein the inner circuit is configured so that the inner coolant circulates through the inner circuit via forced convection.

6. The multistage cooling system of claim 1, wherein the inner coolant is liquid.

7. The multistage cooling system of claim 6, further comprising a valve, connectable between the inner circuit and a water system of the aircraft, via which liquid inner coolant lost from the inner circuit is at least partially replaceable by water from the water system during operation of the aircraft electronic system.

8. The multistage cooling system of claim 7, wherein the water at least partially replacing the liquid inner coolant comprises additives admixed therewith.

9. The multistage cooling system of claim 1, further comprising an adsorption cooling system, coupled to the heat exchanger, to cool outer coolant exiting the heat exchanger.

10. The multistage cooling system of claim 1 wherein the outer coolant further comprises additives admixed with the fresh water.

11. The multistage cooling system of claim 1 further comprising a first valve connecting the inner circuit to a feed line, wherein circulation of the inner coolant in the container is replaced by a stream of an additional coolant supplied from outside to the inner circuit when the first valve is opened.

12. The multistage cooling system of claim 11, further comprising a second valve disposed in the inner circuit, wherein the inner coolant exits the inner circuit via the second valve when the second valve is opened.

* * * * *